(12) United States Patent
Wennekamp et al.

(10) Patent No.: US 7,669,102 B1
(45) Date of Patent: Feb. 23, 2010

(54) JTAG TO SPI PROM CONDUIT

(75) Inventors: Wayne E. Wennekamp, Rio Rancho, NM (US); Randal Kuramoto, San Carlos, CA (US); James A. Walstrum, Jr., San Jose, CA (US); Sanja Srivastava, San Jose, CA (US); Neil G. Jacobson, Los Altos, CA (US)

(73) Assignee: XILINX, Inc., San Jose, CA (US)

( * ) Notice: Subject to any disclaimer, the term of this patent is extended or adjusted under 35 U.S.C. 154(b) by 677 days.

(21) Appl. No.: 11/514,425

(22) Filed: Sep. 1, 2006

(51) Int. Cl.
  *G01R 31/28* (2006.01)
  *G06F 7/38* (2006.01)
  *H03K 19/173* (2006.01)
  *G06F 13/00* (2006.01)
(52) U.S. Cl. .................. 714/744; 714/725; 714/726; 714/727; 326/38; 326/39; 326/46; 326/47; 711/103; 711/170
(58) Field of Classification Search .............. 714/744, 714/725–727; 326/38, 39, 46, 47; 711/103, 711/170
See application file for complete search history.

(56) References Cited

U.S. PATENT DOCUMENTS 6,044,025 A * 3/2000 Lawman ............... 365/191
7,078,929 B1 * 7/2006 Draper et al. ............ 326/16
7,281,082 B1 * 10/2007 Knapp .................. 711/103
7,397,274 B1 * 7/2008 Tang et al. .............. 326/40
7,454,556 B1 * 11/2008 Knapp .................. 711/101

OTHER PUBLICATIONS

Rick Folea; "Programming Flash Memory from FPGAs and CPLDs Using the JTAG Port"; Xilinx Xcell Journal; Summer 2004; pp. 1-3.*
Kris Chaplin; "Reconfiguring Block RAMs—Part 1 and Part 2"; Jul. 17, 2003.*

* cited by examiner

*Primary Examiner*—John J Tabone, Jr.
(74) *Attorney, Agent, or Firm*—Thomas A. Ward

(57) ABSTRACT

A memory coupled to a programmable logic device (PLD) is configured through the PLD's JTAG port. A soft core loaded into the PLD connects to the JTAG port and memory. An external programming host device connects to the JTAG port, sends instructions and data to and receives data from the memory via the JTAG port and soft core. A synchronization JTAG instruction is loaded, and a Shift Data state of the JTAG port state machine is used. The programming host device and soft core are synchronized, and a memory chip select is asserted. A memory instruction, such as READ, WRITE or ERASE is loaded into the memory. An RTI state of the state machine is used to wait for instruction completion and the chip select is deasserted. Another instruction is processed starting with using the Shift Data state. Alternatively, a PLD Shift Data Register is used in conjunction with the soft core.

18 Claims, 6 Drawing Sheets

JTAG TO SPI PROM CONDUIT

BACKGROUND

1. Technical Field

The present invention relates generally to Programmable Logic Devices (PLDs) that are programmable through what is commonly known as the Joint Test Action Group (JTAG) port, but otherwise is officially known as the IEEE Standard 1149.1 port. More particularly, the present invention relates to a soft core for a PLD that allows a user to access a Serial Peripheral Interface (SPI) Programmable Read Only Memory (PROM).

2. Related Art

Programmable Logic Devices (PLDs) exist as a well-known type of integrated circuit (IC) that may be programmed by a user to perform specified logic functions. PLDs are typically used on a Printed Circuit Board (PCB) to enable programming or instantiating various components on the PCB. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

A configuration memory internal to a PLD is typically programmed through a PLD's JTAG port. JTAG is a four-wire interface primarily used for system testing and debugging, but the JTAG interface is also commonly used as a programming interface for Field Programmable Gate Arrays (FPGAs), Complex PLDs (CPLDs), and some microcontrollers, processors, and digital signal processors (DSPs.). Two defining specifications for JTAG are IEEE 1149.1 and IEEE 1532. The "JTAG Port" is commonly referred to as the JTAG or 1149.1 test access port, or "TAP." The IEEE 1149.1 is the evolutionary standard. The IEEE 1532 is based on the IEEE 1149.1. For convenience further reference to such a port herein will be referred to as "JTAG Port," although it is understood that this is intended to reference JTAG, TAP, IEEE 1149.1, IEEE 1532 or similar port structures.

A PLD such as an FPGA may be coupled to a Serial Peripheral Interface Programmable Read Only Memory (SPI PROM). The SPI PROM is a nonvolatile memory chip in which the content is created by a user rather than by the manufacturer of the chip. In order for a programming host device external to the FPGA to work with the SPI PROM, SPI ports would also have to be connected with the FPGA and SPI software used to access the SPI PROM. This would mean adding four pins to such items as programmer sockets.

It would be desirable to provide a process by which a user can use JTAG software to access an SPI PROM associated with an FPGA via the already existing JTAG ports of the FPGA.

SUMMARY

Embodiments of the present invention include a system for configuring a memory, such as an SPI PROM, through a JTAG port contained in a PLD, such as an FPGA, the JTAG port having a JTAG state machine.

In some embodiments, a soft core is loaded into the PLD and is connected to the JTAG port through JTAG test data input (TDI) and output (TDO) lines and to the SPI PROM through SPI PROM input and output lines. A programming host device external to the PLD and connected to the JTAG port through JTAG interface TDI and TDO lines sends instructions and data to the SPI PROM and receives data from the SPI PROM via the JTAG port and soft core.

A SYNC JTAG instruction is initially loaded, and the user goes into the Shift Data (SD) state of the JTAG state machine. The SYNC JTAG instruction provides for synchronization and grants access to registers in the soft core. Upon receipt of the instruction, a first synchronization code is sent to the soft core, an identification code is sent back to the programming host device, and a second synchronization code is sent to the soft core in order to synchronize the programming host device and the soft core.

The soft core then asserts an SPI PROM chip select. An SPI PROM instruction and/or data, such as READ, WRITE or ERASE, are loaded from the programming host device to the SPI PROM. The user goes into the Run Test Idle (RTI) state of the JTAG state machine to wait for the instruction to process and/or the data to be sent. Once the instruction finishes processing, the SPI PROM chip select is deasserted. To process another SPI PROM instruction, the process loops back to the step of going into the Shift Data state.

In alternate embodiments, the user goes into the RTI state of the JTAG state machine to assert the SPI PROM chip select. First, a shift register length equal to the SPI PROM instruction plus the page size of the SPI PROM is created. The SYNC JTAG instruction is loaded once and the programming host device and soft core are synchronized once. The SPI PROM instruction and data is loaded into the register. Once the register is loaded, the user goes into the RTI state of the JTAG state machine to assert the chip select and send the instruction and/or data to the SPI PROM. Once the instruction is processed, the user exits RTI to deassert the chip select or waits a number of clock cycles equal to the length of the register to automatically deassert the chip select. To process another SPI PROM instruction, the process loops back to the step of loading an SPI PROM instruction and/or data into the register.

BRIEF DESCRIPTION OF THE DRAWINGS

Further details of the present invention are explained with the help of the attached drawings in which.

DETAILED DESCRIPTION

Figure 1:
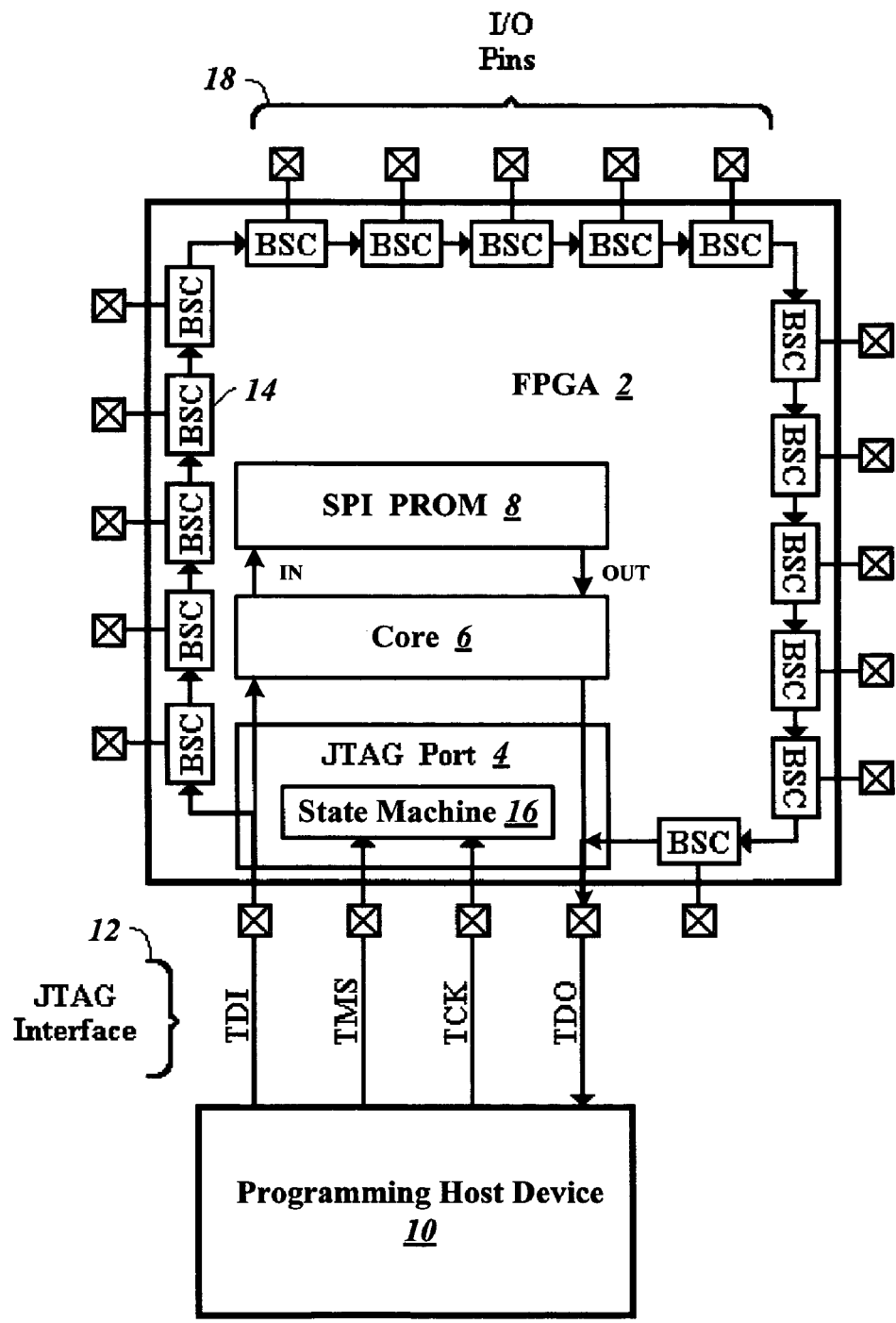
FIG. 1 illustrates a configuration of components for programming a memory in a device with a JTAG port according to embodiments of the present invention.

FIG. 1 illustrates a configuration of components for programming a memory in a device with a JTAG port according to embodiments of the present invention. The device shown is an FPGA 2, although a number of different types of devices with a JTAG port can be used for component 2 of FIG. 1, including without limitation FPGAs, microprocessors, DSPs, PLDs or other devices with in-system programmable (ISP) logic. The following description herein will refer to an FPGA for convenience. In some embodiments, an alternative to the JTAG port 4 can be another type of port that attempts to work by JTAG rules or reasonable modifications thereof. A soft core 6 loaded into the FPGA 2 allows a user to access a memory, such as an SPI PROM 8, in the FPGA 2 using the JTAG port 4 of the FPGA 2. In some embodiments, a PLD may be a combination of an FPGA 2 and an SPI PROM 8 stacked inside of the same package, or otherwise combined into a single chip or package. Although the SPI PROM 8 is shown internal to the FPGA 2, in some embodiments the SPI PROM 8 can also be located external to the FPGA 2. The soft core 6 is a large general purpose logic function used as a building block in chip design and may include a microprocessor or a microcontroller. An alternative to the soft core 6 can be a hardware design that could remain in the FPGA 2 along with the user's design and without interfering with the user's design. Such a hardware design would increase security features and limit write access of the SPI PROM 8.

From a programming host device 10 external to the FPGA 2, commands are sent to the JTAG port 4. The programming host device 10 can be a personal computer, workstation, JTAG test controller, or even a separate microcontroller or DSP on the PCB. Software running on the programming host device 10 interacts with the soft core 6 to enable programming of the SPI PROM. The programming host device sends commands to the JTAG port 4 via a four wire JTAG interface 12 having lines Test Data In (TDI), Test Mode Select (TMS), Test Clock (TCK) and Test Data Out (TDO), as shown in FIG. 1. Data is provided serially between the primary TDI and the primary TDO pin of the JTAG access port 4. The JTAG port 4 controls data flow and receives JTAG control signals from the TMS and TCK inputs. The soft core 6 passes the commands from the JTAG port 4 on to the SPI PROM 8 by controlling the proper pins of the SPI PROM 8, the lines to which are shown as "In" and "Out" in FIG. 1. The soft core 6 can be used with any instruction that the SPI PROM 8 supports including erase, program and read.

In FIG. 1, the test data input and output lines, TDI and TDO, are connected directly between the JTAG port 4 and the soft core 6, as well as to the boundary scan chain 14. The JTAG port 4 has a state machine 16 which is connected to lines TMS and TCK of the JTAG interface 12. JTAG state machine 16 executes the boundary scan functions. The other input/output pins 18 of FPGA 2 connect to other devices (not shown) via non-JTAG interfaces (not shown). Use of the components configuration embodiment shown in FIG. 1 is described subsequently with reference to the process flow chart of FIGS. 3A and 3B.

Figure 2:
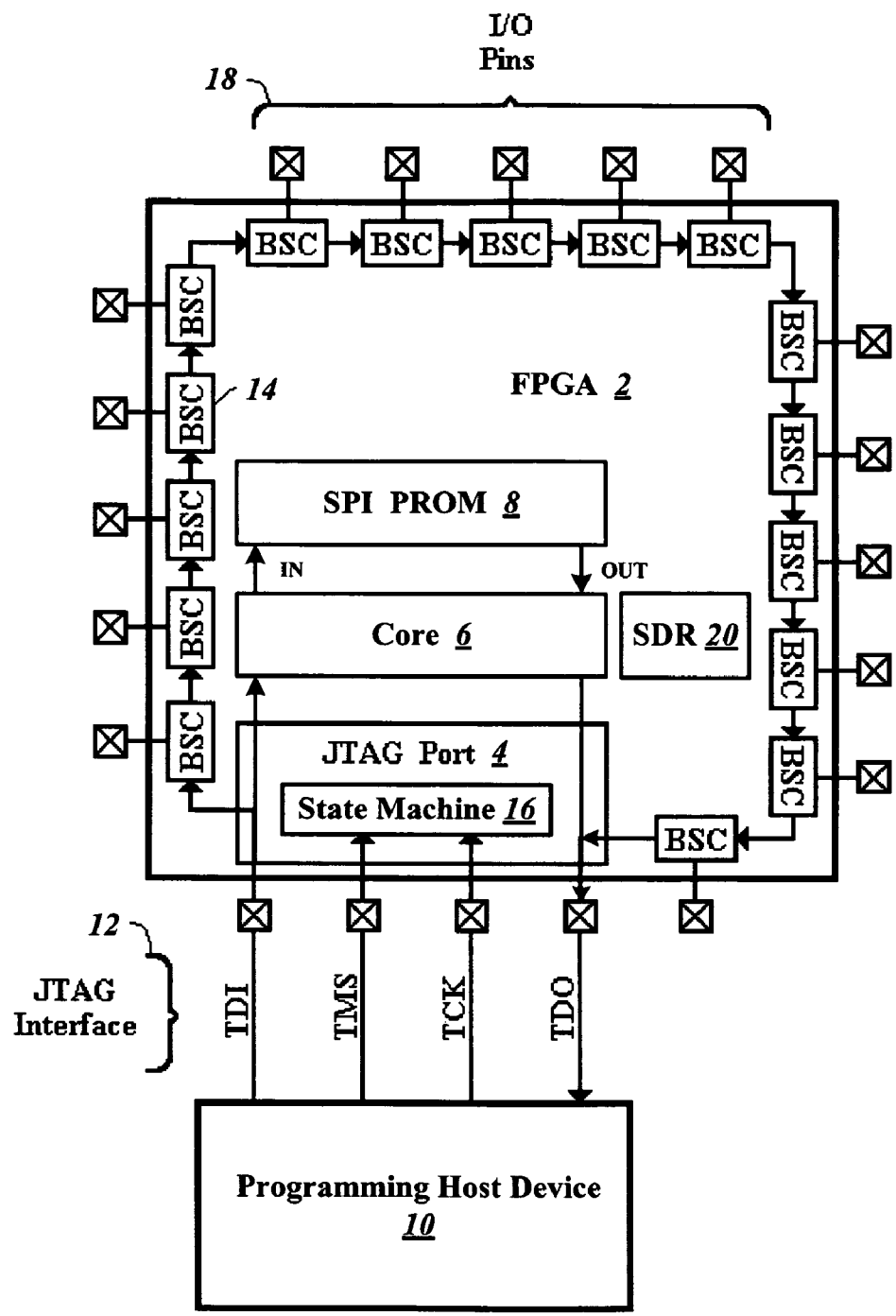
FIG. 2 illustrates an alternate configuration of components for programming a memory in a device with a JTAG port according to embodiments of the present invention.

FIG. 2 illustrates an alternate configuration of components for programming a memory in a device with a JTAG port according to embodiments of the present invention. For convenience, components carried over from FIG. 1 to FIG. 2 are similarly labeled. In FIG. 2, the FPGA 2 contains a Shift Register (SDR) 20, described with respect to the process flow chart of FIGS. 4A and 4B.

Figure 3A:
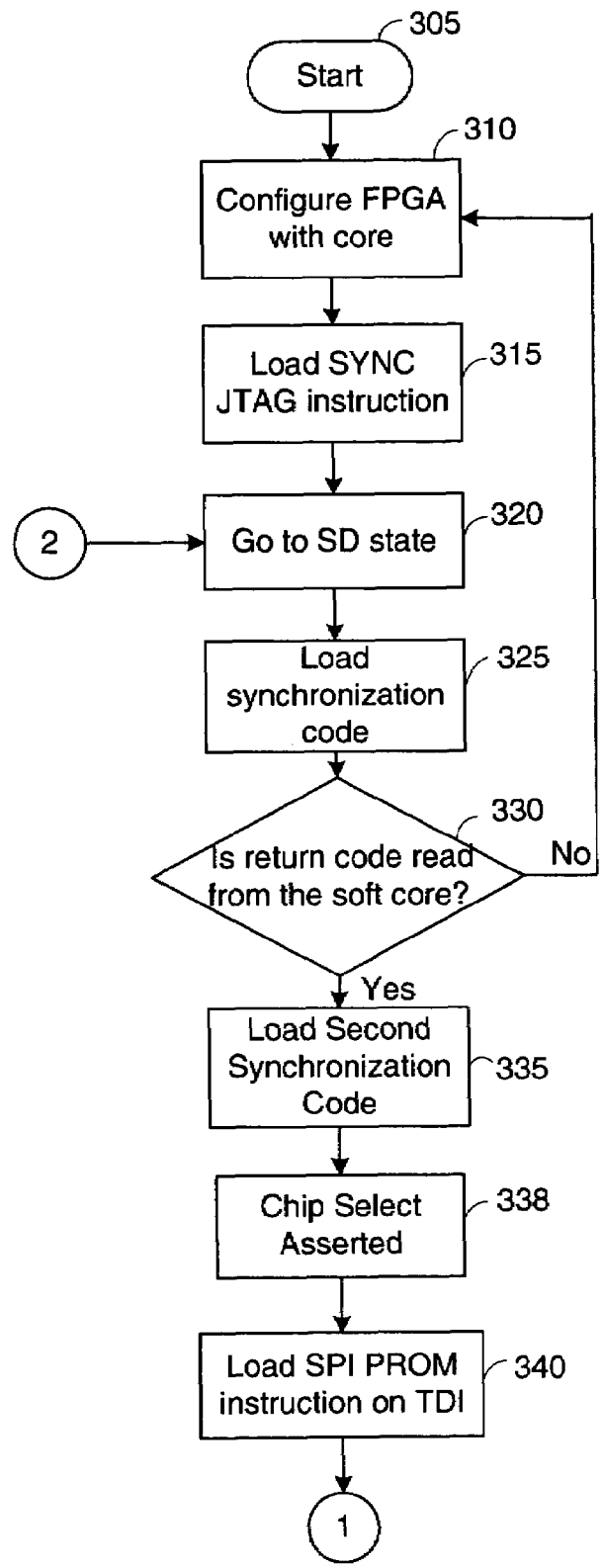
FIGS. 3A and 3B depict a flow chart showing an exemplary FPGA configuration process according to embodiments of the present invention.
Figure 3B:
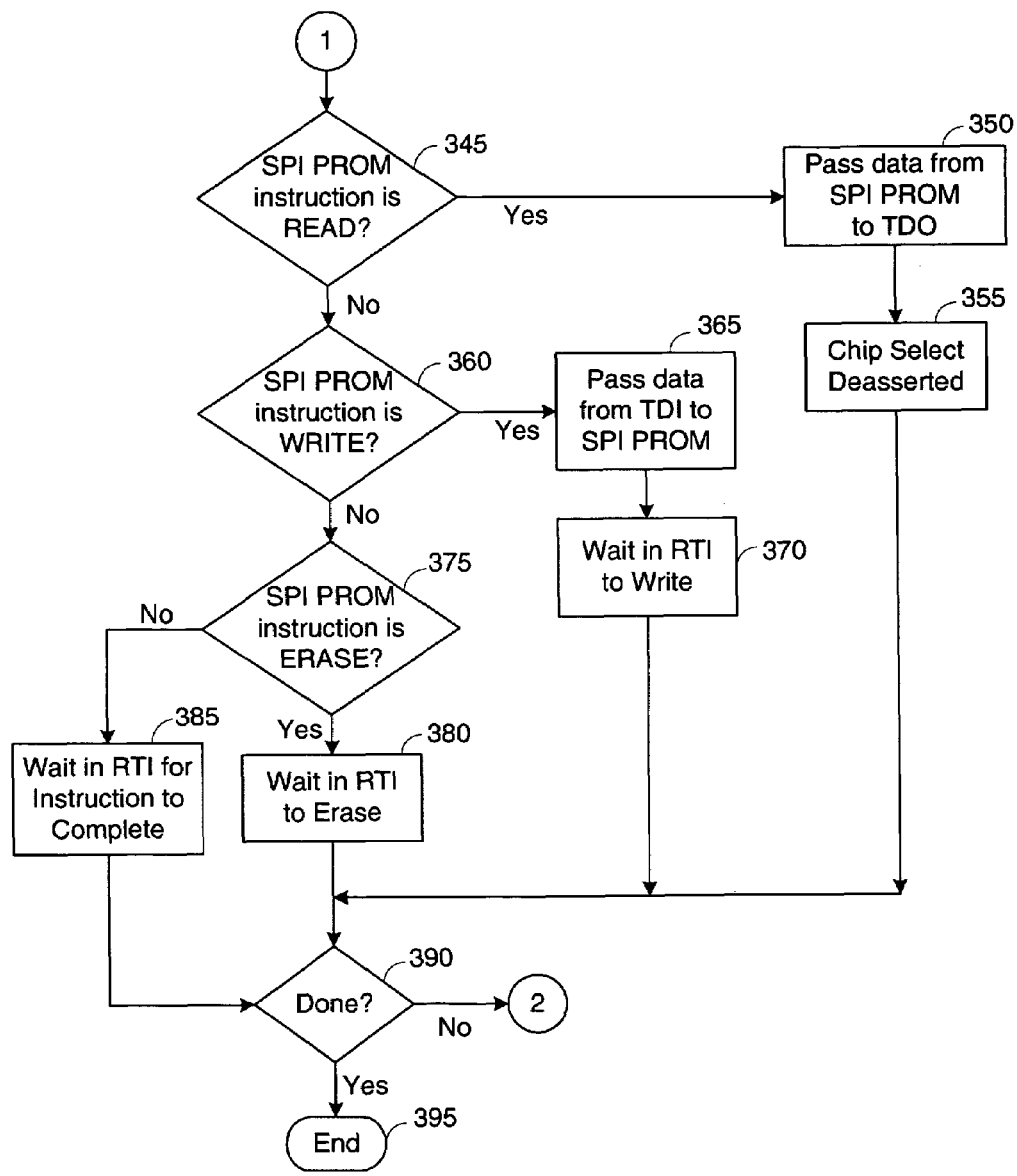

FIGS. 3A and 3B depict a flow chart showing an exemplary FPGA configuration process according to embodiments of the present invention. In FIG. 3A, the process begins in step 305. The FPGA is configured with the soft core in step 310. Once the soft core is loaded into the FPGA, the user can access the SPI PROM via the JTAG port and soft core. Since the JTAG state machine does not have an SPI instruction, the SYNC instruction of the JTAG state machine (or other available user instruction) is used to access the SPI PROM. The SYNC JTAG instruction provides for synchronization and grants access to registers in the soft core. The SYNC JTAG instruction in one embodiment is comparable to a "USER1 JTAG" instruction used on components manufactured by Xilinx, Inc. In some embodiments, a dedicated JTAG SPI instruction could be developed for the JTAG state machine to use instead of, or as part of, the SYNC JTAG instruction to add potential capabilities such as increased security features and limited write access of the SPI PROM. In step 315, the SYNC JTAG instruction is loaded from the programming host device to the JTAG port on the test data input line, TDI. The user goes to the Shift Data (SD) state of the JTAG state machine in step 320 in order to send instructions to the SPI PROM.

Since other cores may also be using the SYNC JTAG instruction, and since the FPGA may be sitting in a chain, a synchronization code is input from the programming host device on TDI to the soft core via the JTAG port to activate the soft core. This synchronization code is loaded into the soft core in step 325. The first time this code is input, the soft core will return a soft core identification code on the JTAG port test data output line, TDO, to the programming host device via the JTAG port. If in step 330 the soft core identification code of indicating receipt of the synchronization code is read by the programming host device, another synchronization code is input from the programming host device on TDI to the soft core via the JTAG port a second time in step 335. The second synchronization code informs the soft core that data will be coming in on TDI that should be sent via input pins to the SPI PROM.

If in step 330, the return synchronization code is not read by the programming host device, an error has occurred, and the process loops back to step 310 to restart the process by configuring the FPGA with a core. Steps 310 through 330 will loop as long as the user continues staying in the SD state of the JTAG state machine or until the synchronization code is input a second time in step 335.

In step 338, the synchronization between the soft core and the programming host device is complete, and at this time, the soft core asserts a chip select for the SPI PROM. In step 340, the SPI PROM instruction and/or data is loaded. The instruction and data are sent by the programming host device to the soft core via the JTAG port on TDI. The soft core sends along the instruction and/or data to the SPI PROM via SPI PROM input pins. If the instruction is a READ instruction, the soft core reads data via SPI PROM output pins and sends the data to the programming host device via the JTAG port on TDO.

In FIG. 3B, in step 345, if the instruction passed along by the soft core to the SPI PROM is a READ instruction, any data read from the SPI PROM is then output onto TDO to the programming host device via the JTAG port in step 350. In step 355, once all the data has been sent, the user exits the Shift Data (SD) state of the JTAG state machine to deassert the chip select asserted in step 338.

In step 345, if the instruction passed along by the soft core to the SPI PROM is not a READ instruction, then if the instruction to the SPI PROM is a WRITE instruction in step 360, data from the programming host device is output onto the JTAG port data input line, or TDI, to the soft core, and the soft core passes along the data to the SPI PROM via SPI PROM input pins in step 365. In step 370, the user goes to the Run Test Idle (RTI) state of the JTAG state machine, thus deasserting the chip select asserted in step 338, to wait until all the data is written to the SPI PROM.

In step 360, if the instruction passed along by the soft core to the SPI PROM is not a WRITE instruction, then if the instruction to the SPI PROM is an ERASE instruction in step 375, the user goes to the Run Test Idle (RTI) state of the JTAG state machine in step 380, thus deasserting the chip select asserted in step 338, to wait for the ERASE instruction to finish.

In step 375, if the instruction passed along by the soft core to the SPI PROM is not an ERASE instruction, then the SPI PROM instruction is some other program instruction input by the user other than READ, WRITE and ERASE. The user then goes to the Run Test Idle (RTI) state of the JTAG state machine in step 385, thus deasserting the chip select asserted in step 338, to wait for the program instruction to finish.

In step 390, if the user is not finished sending instructions and/or data from the programming host device to the SPI PROM, the process loops back to step 320, in which the user then goes back to the Shift Data (SD) state of the JTAG state machine in order to input a new instruction. Each new instruction must be preceded by the synchronization code repeated twice in steps 325 and 335. If the user is finished sending instructions and/or data from the programming host device to the SPI PROM in step 390, the process ends in step 395.

Figure 4A:
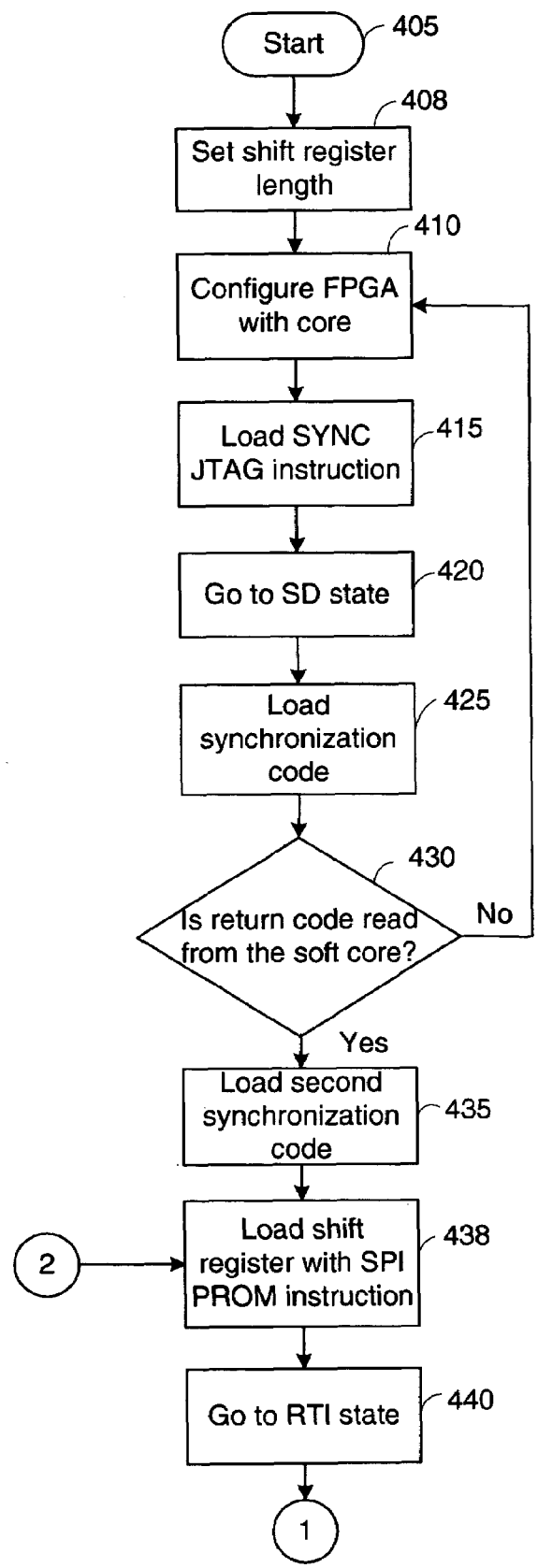
FIGS. 4A and 4B depict a flow chart showing an alternate exemplary FPGA configuration process according to embodiments of the present invention.
Figure 4B:
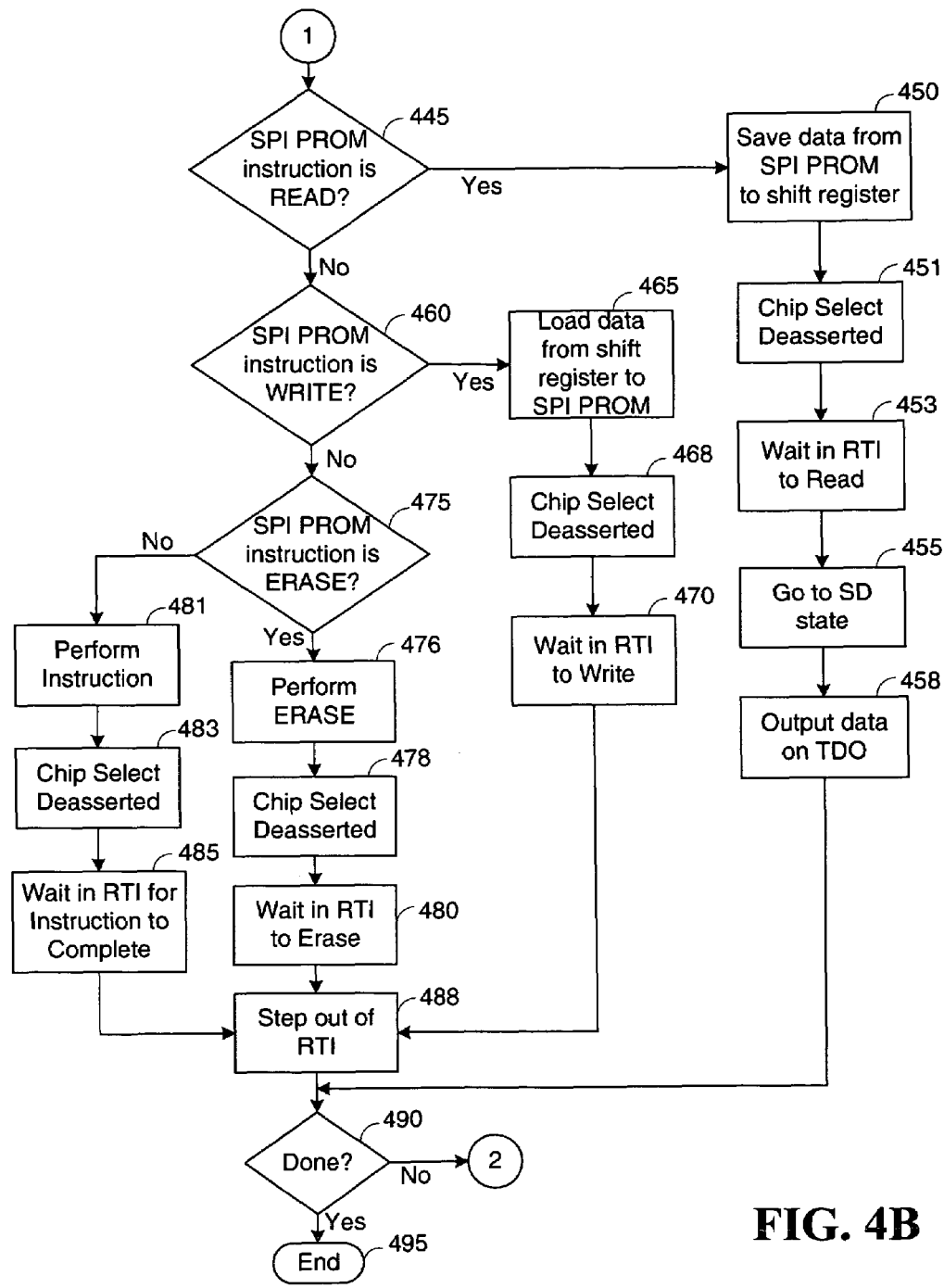

FIGS. 4A and 4B depict a flow chart showing an alternate exemplary FPGA configuration process according to embodiments of the present invention. This flow chart is similar to the one shown in FIGS. 3A and 3B with some variations. Various embodiments may include any combination of such variations. One variation is that instructions and/or data sent from the programming host device to the SPI PROM are loaded into a shift register of the FPGA. The shift register may be implemented in the FPGA fabric as part of the soft core. Another variation is that the Run Test Idle (RTI) state of the JTAG state machine is then used to assert the chip select and send the instructions and/or data to the SPI PROM, and the user either exits the RTI state of the JTAG state machine to deassert the chip select or waits a number of clock cycles equal to the length of the shift register to automatically deassert the chip select.

In FIG. 4A, the process begins in step 405. A shift register of the FPGA length equal to the SPI PROM instruction plus the page size of the SPI PROM is created in step 408. The FPGA is configured with the soft core in step 410. Once the soft core is loaded into the FPGA, the user can access the SPI PROM via the JTAG port and soft core. Since the JTAG state machine does not have an SPI instruction, the SYNC JTAG instruction of the JTAG state machine is used to access the SPI PROM. In step 415, the SYNC JTAG instruction is loaded from the programming host device to the JTAG port on the test data input line, TDI. The user goes to the SD state of the JTAG state machine in step 420 in order to send instructions to the SPI PROM.

Since other cores may also be using the SYNC JTAG instruction, and since the FPGA may be sitting in a chain, a synchronization code is input from the programming host device on TDI to the soft core via the JTAG port to activate the soft core. This synchronization code is loaded into the soft core in step 425. The first time this code is input, the soft core can return a soft core identification code on the JTAG port test data output line, TDO, to the programming host device via the JTAG port. If in step 430, the soft core identification code indicates synchronization did occur, another synchronization code is input from the programming host device on TDI to the soft core via the JTAG port a second time in step 435. The second synchronization code informs the soft core that data will be coming in on TDI that should be sent via input pins to the SPI PROM.

If in step 430, if the return synchronization code is not read by the programming host device, an error has occurred, and the process loops back to step 410 to configure the FPGA with a core. Steps 410 through 430 will loop as long as the user continues staying in the SD state of the JTAG state machine or until the synchronization code is provided a second time in step 435. At this point, the synchronization between the soft core and the programming host device is complete.

In step 438, an SPI PROM instruction and/or data is loaded from the programming host device into the shift register of the FPGA. At this time, no signals would be active going from the soft core to the SPI PROM. Once the shift register is loaded, in step 440, the user goes to the Run Test Idle (RTI) state of the JTAG state machine, which asserts the chip select for the SPI PROM and sends the instruction and/or data to the SPI PROM.

The shift register is implemented in the FPGA fabric as part of the soft core. The instruction and/or data is sent by the programming host device to the JTAG port on TDI, and the JTAG port saves the instruction and/or data to the shift register via TDI. The soft core sends along the instruction and/or data saved in the shift register to the SPI PROM via SPI PROM input pins. The soft core reads data via SPI PROM output pins if the instruction was a READ instruction, saves the data in the shift register, outputs the data from the shift register to the programming host device via the JTAG port on TDO.

In FIG. 4B, in step 445, if the instruction passed along by the soft core to the SPI PROM is a READ instruction, any data read from the SPI PROM is then saved in the shift register via SPI PROM output pins in step 450. The user continues to clock TCK in step 450. After a number of clock cycles equal to the shift register length, the chip select asserted in step 440 is deasserted in step 451. The user continues staying in the Run Test Idle (RTI) state of the JTAG state machine until the data has been saved to the shift register in step 453. The user goes into the SD state of the JTAG state machine in step 455. In step 458, the soft core reads the data in the shift register and outputs the data to the programming host device via the JTAG port on TDO in step 458.

In step 490, if the data output onto TDO in step 458 is complete, and if the user is not finished sending instructions and/or data from the programming host device to the SPI PROM, the process loops back to step 438, in which another SPI PROM instruction and/or data is loaded from the programming host device into the shift register of the FPGA. If in step 490 the data output onto TDO in step 458 is not complete, the user can send in the next SPI PROM instruction and/or data on TDI in step 438 while the data read in step 485 is being output on TDO.

In step 445, if the instruction passed along by the soft core to the SPI PROM is not a READ instruction, then if the instruction to the SPI PROM is a WRITE instruction in step 460, the soft core passes along the data stored in the shift register to the SPI PROM via SPI PROM input pins in step 465. The user continues to clock TCK in step 465. After a number of clock cycles equal to the shift register length, the chip select asserted in step 440 is deasserted in step 468. The user continues staying in the Run Test Idle (RTI) state of the JTAG state machine until the WRITE instruction is completed in step 470. The user exits the Run Test Idle (RTI) state of the JTAG state machine in step 488.

In step 460, if the instruction passed along by the soft core to the SPI PROM is not a WRITE instruction, then if the instruction to the SPI PROM is an ERASE instruction in step 475, the ERASE instruction is performed in step 476. The user continues to clock TCK in step 476. After a number of clock cycles equal to the shift register length, the chip select asserted in step 440 is deasserted in step 478. The user continues staying in the Run Test Idle (RTI) state of the JTAG state machine until the ERASE instruction is completed in step 480. The user exits the Run Test Idle (RTI) state of the JTAG state machine in step 488.

In step 475, if the instruction passed along by the soft core to the SPI PROM is not an ERASE instruction, then the SPI PROM instruction is some other program instruction input by the user other than READ, WRITE and ERASE. In step 481, the SPI PROM instruction is performed, and the user continues to clock TCK. After a number of clock cycles equal to the shift register length, the chip select asserted in step 440 is deasserted in step 483. The user continues staying in the RTI state of the JTAG state machine until the instruction is completed in step 485. The user exits the RTI state of the JTAG machine in step 488.

In step 490, if the user is not finished sending instructions and/or data from the programming host device to the SPI PROM, the process loops back to step 438, in which another SPI PROM instruction and/or data is loaded from the programming host device into the shift register of the FPGA. The synchronization code is not needed since the shift register is a fixed length. One goal of using a shift register is to achieve JTAG 1149.1 compliance. This requires that while in a boundary scan chain the shift register be a fixed length for a given instruction. Since the length is fixed and known, data can be synchronized by the programming host device to each part in the chain on its own. If the user is finished sending instructions and/or data from the programming host device to the SPI PROM in step 490, the process ends in step 495.

In some embodiments, the FPGA could contain memory that allows the user to identify that the SPI PROM has been already programmed and that no further writes to the SPI PROM should be allowed. In some embodiments, reads of the SPI PROM may be blocked or hindered, except when a programmed key is given. These features can be used to enhance security and restrict access to the SPI PROM.

In some embodiments, the process of FIGS. 3A and 3B, as well as FIGS. 4A and 4B are performed automatically from the programming host device.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for configuring a Serial Peripheral Interface Programmable Read Only Memory (SPI PROM) used in conjunction with a programmable logic device (PLD), the method comprising:
    providing a Joint Test Action Group (JTAG) port having a JTAG state machine contained within the PLD;
    loading a soft core into the PLD;
    coupling the soft core to the JTAG port; and
    coupling the SPI PROM to the soft core,
    wherein instructions and data are sent to the SPI PROM and data is received from the SPI PROM via the JTAG port and the soft core,
    sending, by a programming host device, a first synchronization code to the soft core;
    sending an identification code from the soft core; and
    sending, by the programming host device, a second synchronization code to the soft core, wherein the programming host device and the soft core are synchronized by the second synchronization code, and the second synchronization code instructs the soft core to send an instruction received from the programming host device to the SPI PROM, wherein the instruction and each new instruction is preceded by the first synchronization code and the second synchronization code.

2. The method of claim 1, further comprising loading to the JTAG state machine a synchronization JTAG instruction to enable the programming host device to access the SPI PROM.

3. The method of claim 2, further comprising entering a Shift Data (SD) state of the JTAG state machine.

4. The method of claim 1, further comprises asserting an SPI PROM chip select by the soft core after the soft core receives the second synchronization code.

5. The method of claim 1, wherein the instruction is a first SPI PROM instruction that is sent to the SPI PROM.

6. The method of claim 5, wherein the first SPI PROM instruction comprises at least one of READ, WRITE and ERASE.

7. The method of claim 5, further comprising:
    passing a set of data from the SPI PROM if the first SPI PROM instruction is a READ instruction;
    waiting in a Run Test Idle (RTI) state of the JTAG state machine until the READ instruction is finished; and
    deasserting the SPI PROM chip select.

8. The method of claim 5, further comprising:
    passing a set of data to the SPI PROM if the first SPI PROM instruction is a WRITE instruction;
    waiting in an RTI state of the JTAG state machine until the WRITE instruction is finished; and
    deasserting the SPI PROM chip select.

9. The method of claim 5, further comprising:
    waiting in an RTI state of the JTAG state machine until an ERASE or other program instruction is finished if the first SPI PROM instruction is an ERASE instruction or other program instruction; and
    deasserting the SPI PROM chip select.

10. The method of claim 5, further comprising:
    entering the SD state of the JTAG state machine;
    resending the first synchronization code to the soft core;
    resending an identification code by the soft core;
    resending a second synchronization code to the SPI PROM; and
    sending a second SPI PROM instruction and data to the SPI PROM.

11. A system for configuring a Serial Peripheral Interface Programmable Read Only Memory (SPI PROM), the system comprising:
    a programmable logic device (PLD);
    a JTAG port having a JTAG state machine contained within the PLD;
    a soft core loaded into the PLD and coupled to the JTAG port; and
    an SPI PROM coupled to the PLD and coupled to the soft core,
    wherein instructions and data are sent to the SPI PROM and data is received from the SPI PROM via the JTAG port and the soft core,
    a programming host device, coupled to the JTAG port, to send a first synchronization code and a second synchronization code to the soft core, wherein the programming host device and the soft core are synchronized by the second synchronization code, and the second synchronization code instructs the soft core to send an instruction received from the programming host device to the SPI PROM, wherein the instruction and each new instruction is preceded by the first synchronization code and the second synchronization code.

12. The system of claim 11, further comprising a shift register, wherein the instruction and data are sent to the SPI PROM and data is received from the SPI PROM via the JTAG port, the soft core, and the shift register.

13. A method for configuring a Serial Peripheral Interface Programmable Read Only Memory (SPI PROM) used in conjunction with a programmable logic device (PLD), the method comprising:
    providing a Joint Test Action Group (JTAG) port having a JTAG state machine within the PLD;

loading a soft core into the PLD;
coupling the soft core to the JTAG port;
coupling the SPI PROM to the soft core; and
creating a shift register of the PLD with a length equal to an SPI PROM instruction plus a page size of the SPI PROM,
wherein instructions and data are sent to the SPI PROM and data is received from the SPI PROM via the JTAG port, the soft core and the shift register,
loading to the JTAG state machine a synchronization JTAG instruction to provide access to the SPI PROM;
entering a Shift Data (SD) state of the JTAG state machine;
sending, by a programming host device, a first synchronization code to the soft core;
sending an identification code from the soft core; and
sending, by the programming host device, a second synchronization code to the soft core, wherein the programming host device and the soft core are synchronized by the second synchronization code, and the second synchronization code instructs the soft core to send an instruction received from the programming host device to the SPI PROM.

14. The method of claim 13, wherein the instruction is a first SPI PROM instruction, further comprising:
loading the shift register with the first SPI PROM instruction;
entering a Run Test Idle (RTI) state of the JTAG state machine;
asserting an SPI PROM chip select by the soft core; and
sending the first SPI PROM instruction to the SPI PROM.

15. The method of claim 14, further comprising:
saving a first set of data from the SPI PROM to the shift register if the first SPI PROM instruction is a READ instruction;
waiting in the RTI state of the JTAG state machine until the first set of data is saved to the shift register;
exiting the RTI state of the JTAG state machine to deassert the SPI PROM chip select;
reading the first set of data in the shift register by the soft core;
sending the first set of data read from the shift register by the soft core.

16. The method of claim 14, further comprising:
passing a second set of data from the shift register to the SPI PROM by the soft core if the first SPI PROM instruction is a WRITE instruction;
waiting a number of clock cycles equal to the shift register length;
deasserting the SPI PROM chip select;
waiting in the RTI state of the JTAG state machine until the WRITE instruction is finished; and
exiting the RTI state of the JTAG state machine.

17. The method of claim 14, further comprising:
performing an ERASE instruction or other program instruction if the first SPI PROM instruction is an ERASE instruction;
waiting a number of clock cycles equal to the shift register length;
deasserting the SPI PROM chip select;
waiting in the RTI state of the JTAG state machine until the ERASE instruction; and
exiting the RTI state of the JTAG state machine.

18. The method of claim 14, further comprising:
loading the shift register with a second SPI PROM instruction and/or data;
entering an RTI state of the JTAG state machine;
asserting an SPI PROM chip select by the soft core; and
sending the second SPI PROM instruction and/or data to the SPI PROM.

* * * * *

UNITED STATES PATENT AND TRADEMARK OFFICE
CERTIFICATE OF CORRECTION

PATENT NO. : 7,669,102 B1  Page 1 of 1
APPLICATION NO. : 11/514425
DATED : February 23, 2010
INVENTOR(S) : Wennekamp et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 836 days.

Signed and Sealed this

Seventh Day of December, 2010

David J. Kappos
*Director of the United States Patent and Trademark Office*